(12) United States Patent
Krause et al.

(10) Patent No.: US 7,335,461 B2
(45) Date of Patent: *Feb. 26, 2008

(54) METHOD OF STRUCTURING OF A SUBTRATE

(75) Inventors: Rainer Klaus Krause, Kostheim (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/460,005

(22) Filed: Jul. 26, 2006

(65) Prior Publication Data

US 2006/0257792 A1    Nov. 16, 2006

Related U.S. Application Data

(63) Continuation of application No. 10/707,288, filed on Dec. 3, 2003, now Pat. No. 7,270,940.

(30) Foreign Application Priority Data

Dec. 18, 2002   (EP) ................................ 02102797

(51) Int. Cl.
   *G03F 7/00*  (2006.01)
   *G03F 7/004* (2006.01)

(52) U.S. Cl. ..................... 430/311; 430/313; 430/314; 430/325; 430/330

(58) Field of Classification Search ............... 430/311, 430/313, 314, 325, 330
   See application file for complete search history.

(56) References Cited

U.S. PATENT DOCUMENTS

| | | | |
|---|---|---|---|
| 4,731,346 A * | 3/1988 | Ashwell ..................... | 438/784 |
| 4,751,170 A | 6/1988 | Mimura et al. | |
| 4,810,601 A | 3/1989 | Allen et al. | |
| 4,950,583 A * | 8/1990 | Brewer et al. .............. | 430/311 |
| 5,130,782 A * | 7/1992 | Ashwell ..................... | 257/794 |
| 5,407,786 A | 4/1995 | Ito et al. | |
| 6,020,028 A | 2/2000 | Kinneberg | |
| 6,060,212 A * | 5/2000 | McCulloch et al. ..... | 430/270.1 |
| 6,103,399 A | 8/2000 | Smela et al. | |
| 6,577,802 B1 | 6/2003 | Chien | |

(Continued)

FOREIGN PATENT DOCUMENTS

DE    4331519 A1    3/1994

(Continued)

OTHER PUBLICATIONS

SPIE Micromachining & Microfabrication Symposium '96, "Imaging and Resist Technologies for the Micromachining Industry", David Craven, pp. 1-21.

*Primary Examiner*—Amanda Walke
(74) *Attorney, Agent, or Firm*—Ira D. Blecker; Wenjie Li

(57) ABSTRACT

The invention relates to a method of structuring of a substrate by providing a polymerization starter layer on the substrate, applying a radiation field on the polymerization starter layer for selectively reducing a density of polymerization starters of the polymerization starter layer, applying monomers and then polymerizing of the monomers, the polymerization being initiated by the starters of the polymerization starter layer, and structuring the substrate using the polymerized monomers as a mask.

12 Claims, 4 Drawing Sheets

U.S. PATENT DOCUMENTS

| | | |
|---|---|---|
| 6,884,314 B2 | 4/2005 | Cross et al. |
| 6,946,390 B2 * | 9/2005 | Schmidt .................... 438/637 |
| 6,969,690 B2 | 11/2005 | Zhou et al. |
| 7,171,975 B2 * | 2/2007 | Moon et al. ............. 137/15.01 |

FOREIGN PATENT DOCUMENTS

| | | |
|---|---|---|
| WO | WO2002054458 A2 | 7/2002 |

* cited by examiner

METHOD OF STRUCTURING OF A SUBTRATE

BACKGROUND OF INVENTION

1. Field of the Invention

The present invention relates to the field of structuring of substrates, and more particularly without limitation, to semiconductor and micromachined devices.

2. Background and Prior Art

Microchip manufacturing relies on photolithography, a process similar to photography, to define the shape and pattern of individual surface features. A film of photoreactive polymer, known as a photoresist, is applied to the surface of a silicon wafer where a latent image is generated in the photoresist by exposure to light.

Photolithography can also be used for producing a three dimensional topography. For this purpose several photolithographic steps have to be performed in a sequence. The difficulty with two or more layers of topography is that the layer alignment is difficult to achieve. This difficulty limits the precision of the structuring of the substrate. As a consequence certain structures such as lenses having a defined focal point can to date not be produced by means of photolithographic multilayer processes.

Another field of application of photolithography is micromachining of miniature mechanical or other devices. It is a particular challenge for such applications to produce steps, slopes or other surface variations. The ability to coat the substrate with a uniform thickness of photo resist has been identified as one of the toughest challenges in the area of pattern definition for high topography structures (cf. SPIE Micromachining & Microfabrication Symposium '96, "Imaging and Resist Technologies for the Micromachining Industry", David Craven).

There is therefore a need for providing of an improved method of structuring of a substrate, in particular for producing miniature steps, slopes or other surface variations of the substrate and for semiconductor manufacturing.

SUMMARY OF INVENTION

The present invention provides for a method of structuring of a substrate which enables to fabricate three dimensional topologies without a need for multiple layers of photolithography.

In accordance with a preferred embodiment of the invention this is accomplished by immobilizing a layer of polymerization staffers on the substrate surface. The immobilization of the polymerization staffers can be accomplished by providing a coating on the substrate surface with which the polymerization staffers can form covalent bonds. For example if azomonochlorosilane (AMCS) is used as a polymerization staffer an appropriate coating of the substrate surface is SiOx.

The density of the polymerization starters which are immobilized on the substrate surface is then modulated by selectively reducing the density of the polymerization starters. This can be done by applying a suitable radiation field, such as a UV radiation field which depending on its intensity cracks more or less of the polymerization starters. Due to the density distribution of the polymerization starters on the surface of the substrate a subsequent polymerization step results in a corresponding three dimensional structure. This structure can be used as a complex mask for a subsequent structuring step.

In accordance with a further preferred embodiment of the invention the polymerization starter layer is a mono-molecular layer of starter molecules. Such a mono-molecular layer is advantageous as it enables a very high spatial resolution of the three dimensional topography.

In accordance with a further preferred embodiment of the invention a radiation source emitting a substantially homogeneous radiation field is employed. The homogenous radiation field is modulated by means of a gray mask or a grating mask in order to provide an inhomogeneous radiation field for selectively reducing the density of the polymerization starters.

In accordance with a further preferred embodiment of the invention the homogeneous radiation field is modulated such that the resulting structure which is produced on the surface of the substrate has the form of a lens with a defined focal point.

In particular the invention enables to produce semiconductor and micromachined devices having a multiple layer topography but only a single crystal growth edge. This is in contrast to the prior art where the production of multiple layer three dimensional topographies requires several photolithography steps. The sequence of photolithography steps results in so called growth edges in the crystal growth. In other words each photolithography step results in an additional growth line or growth edge when a crystal is grown between the lithography steps.

The present invention enables to fabricate a semiconductor or micromachined device in a single crystal growth step as multiple step lithography is made superflous by the complex three dimensional mask in accordance with the present invention.

Examples of such devices include a slider ABS surface, padded slider, recessed P3 structure on a magnetic recording head as well as micro/nano structures with multiple layer topography.

BRIEF DESCRIPTION OF DRAWINGS

In the following a preferred embodiment of the invention will be described in greater detail by making reference to the drawings in which.

DETAILED DESCRIPTION

Figure 1:
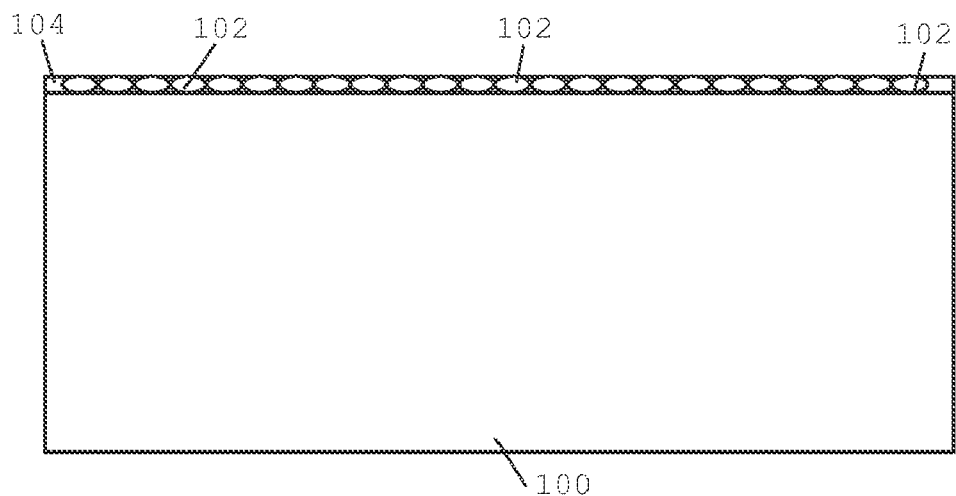
FIG. 1 shows a substrate with a polymerization starter layer.

FIG. 1 shows a substrate 100. Substrate 100 is a silicon wafer or another kind of wafer material. On top of substrate 100 a mono-molecular layer of polymerization starter molecules 102 is applied. The polymerization starters 102 are immobilized on the surface of substrate 100. Preferably the immobilization of the polymerization starters 102 is accomplished by covalent bonds which are formed between the polymerization starters 102 and the substrate 100.

To facilitate the formation of covalent bonds between the polymerization starters 102 and the surface of substrate 100 there is a coating 104 on substrate 100 onto which the polymerization starters 102 are applied. The polymerization starters 102 form covalent bonds with the coating 104.

Preferably the coating 104 consists of a layer of SiOx to secure optimal polymerization conditions. The polymerization staffer 102 is selected depending on the surface conditions of substrate 100 and coating 104. For example azomonochlorosilane (AMCS) is used as a polymerization starter which is applied onto coating 104 substrate 100 by dip or contact coating of the polymerization starter solution. The SiOx coating 104 ensures good starter bonding for immobilization of the polymerization starter molecules 102 on the substrate 100.

Figure 2:
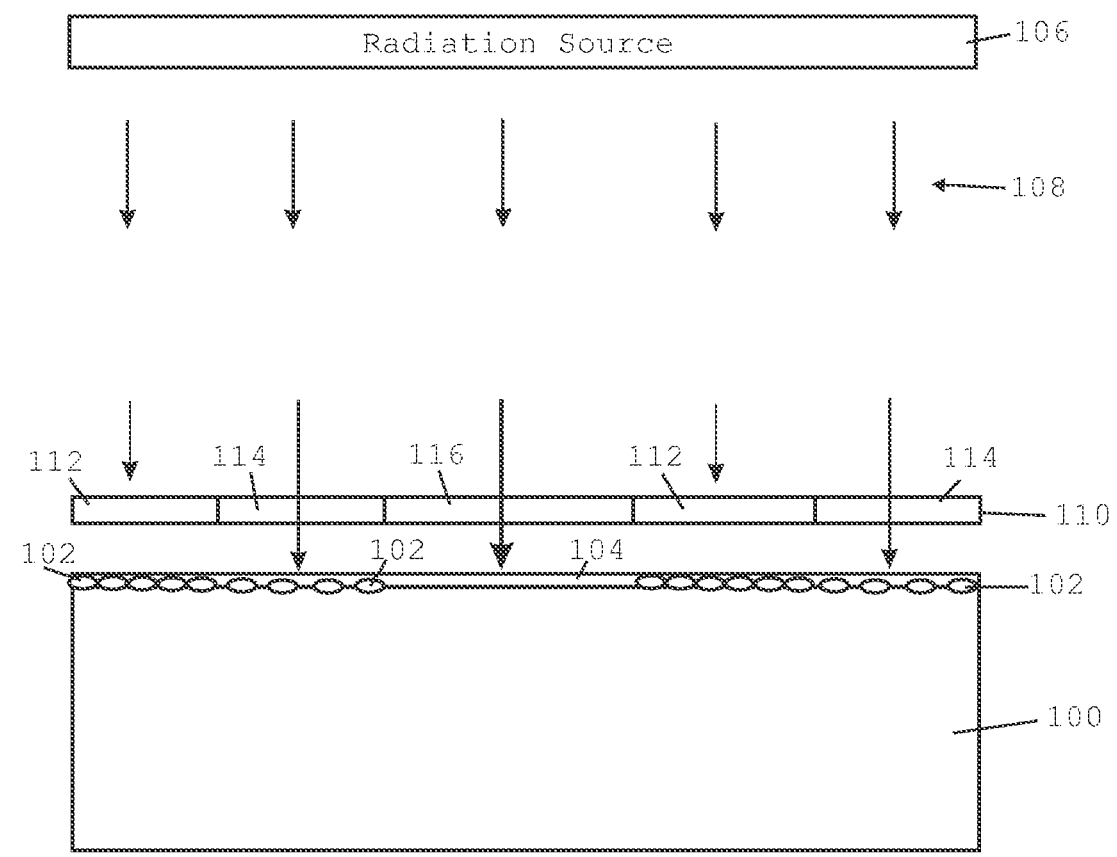
FIG. 2 is illustrative of the application of a radiation field for selectively reducing the density of the polymerization starters.

FIG. 2 illustrates the application of a radiation field on the polymerization starters 102 in order to modulate the density of the active polymerization starters 102. The radiation source 106 provides a homogeneous radiation field 108. For example radiation source 106 is a UV light lamp. The UV light which is emitted by the radiation source 106 is transformed into homogeneous radiation field 108 by means of a gray mask or other appropriate optical means which are as such known from the prior art of photolithographic processes.

A gray mask 110 is used for modulation of the homogeneous radiation field 108. Gray mask 110 has areas 112 which absorb the UV light which falls on these areas. This means that no UV light of the homogeneous radiation field 108 penetrates the areas 112 of the gray mask 110 such that the polymerization starters 102 which are located underneath the areas 112 are not subjected to UV radiation. As a consequence the density of polymerization starters 102 under these areas 112 remains unchanged.

Gray mask 110 has areas 114 which absorb some of the UV light of the homogeneous radiation field 108. As a result the polymerization starters 102 underneath the areas 114 are subjected to UV light having a reduced intensity as compared to the original intensity of the homogeneous radiation field 108. The intensity of the UV light impinging upon the surface of the substrate 100 is determined by the absorption index of the areas 114. As a consequence the density of the polymerization starters underneath areas 114 is reduced correspondingly. Depending on the intensity of the UV light impinging upon the surface of the substrate 100 a greater or a lower number of polymerization starters 102 are cracked and thereby deactivated such that a reduced density of active polymerization starters 102 remains in areas 114.

Further gray mask 110 has areas 116 which are transparent for radiation field 108 and which do not absorb the UV light of radiation field 108. Depending on the intensity of the homogeneous radiation field 108 the polymerization starters 102 underneath areas 116 are cracked. If the intensity of the homogeneous radiation field 108 is sufficiently high all of the polymerization starters 102 are removed underneath areas 116.

By means of gray mask 110 the homogeneous radiation field 108 is modulated such that the UV exposure of the polymerization starters 102 is also locally modulated. In areas where the local intensity of the modulated radiation field is zero the original density of the polymerization starters is unchanged; in other areas where the intensity of the modulated radiation field is greater than zero but below the intensity of the original homogeneous radiation field 108 the population of the polymerization starters 102 is reduced depending on the local radiation field strength. In areas where the intensity of the modulated radiation field is equal to the original intensity of the homogeneous radiation field 108 most or all of the polymerization starters are cracked and thus deactivated.

It is to be noted that the modulation of the homogeneous radiation field 108 is not limited to a step function but that any other kind of modulation function can be realized by using a corresponding gray mask. The gray mask can have any gray level image in order to implement a desired modulated radiation field.

After the UV exposure polymerization is started by applying monomers onto the surface of substrate 100. For polymerization of the monomers an active polymerization starter 102 is required. As a consequence no polymerization occurs in areas where the population of the polymerization starters 102 has been reduced to zero by the UV exposure of the modulated radiation field.

In other areas where the polymerization starters 102 have been subjected to UV exposure with a reduced intensity due to the absorption of the gray mask 110 there is a correspondingly limited number of polymerizations; as a consequence the extension of the resulting structures 118 into the vertical direction is also reduced as compared to the vertical extend of structures 120 where the original polymerization starter population has survived the UV exposure step due to the shielding of the completely absorbing areas of the gray mask.

Preferably a wash step is performed after polymerization to wash off any free polymer chains from the substrate surface.

Figure 3:
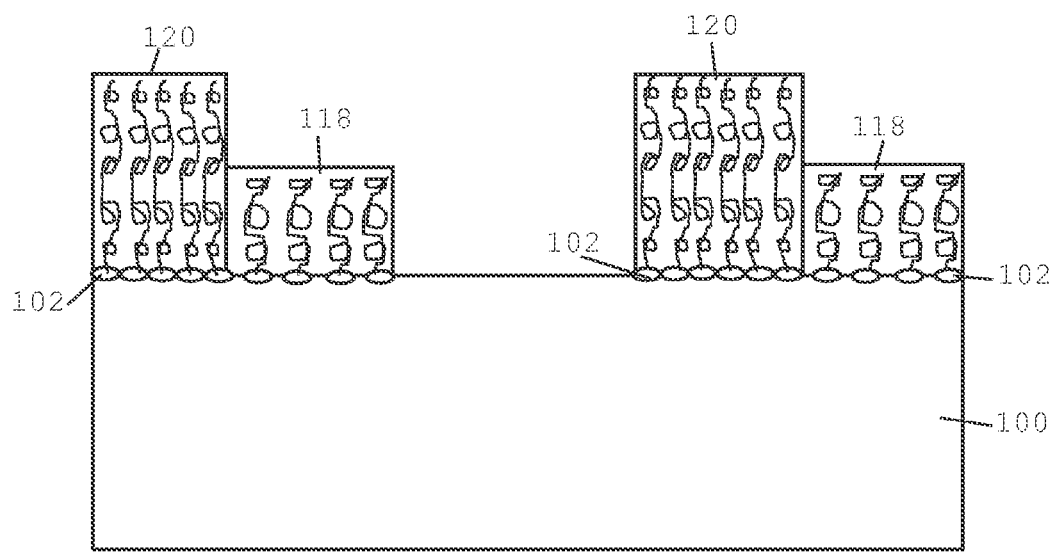
FIG. 3 shows the substrate after polymerization.

As apparent from FIGS. 2 and 3 the modulation of the intensity of radiation field 108 by gray mask 110 results in a corresponding modulation of the vertical extension of the resulting structure formed by the polymerization step of FIG. 3. This way any required three dimensional topography formed by the locally varied polymerization can be formed on top of substrate 100.

Figure 4:
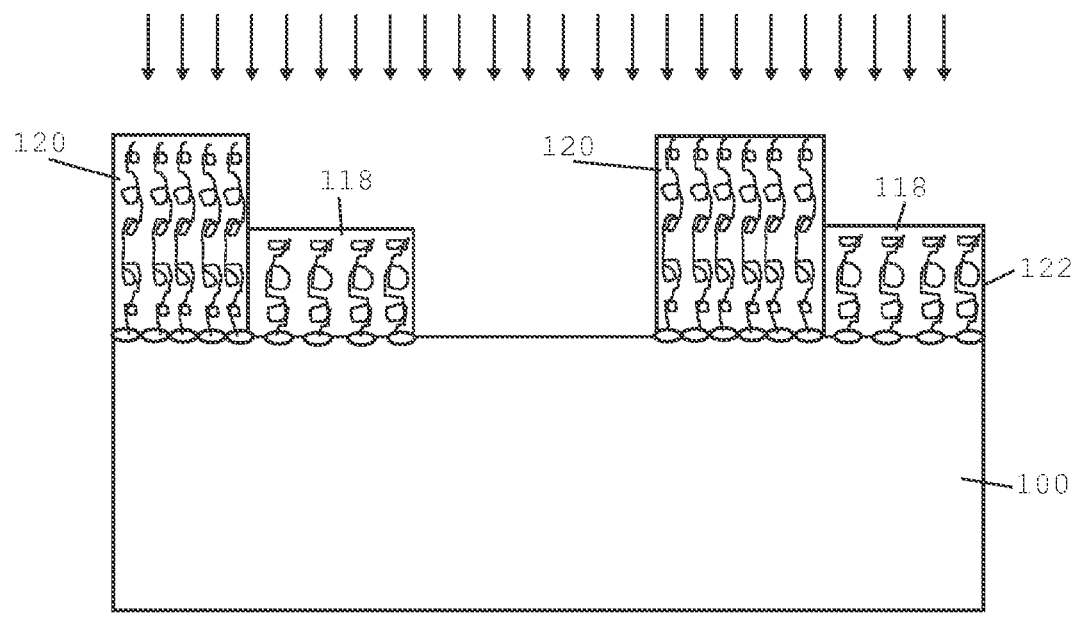
FIG. 4 is illustrative of a processing step using the structure provided by the polymerization as a mask.
Figure 5:
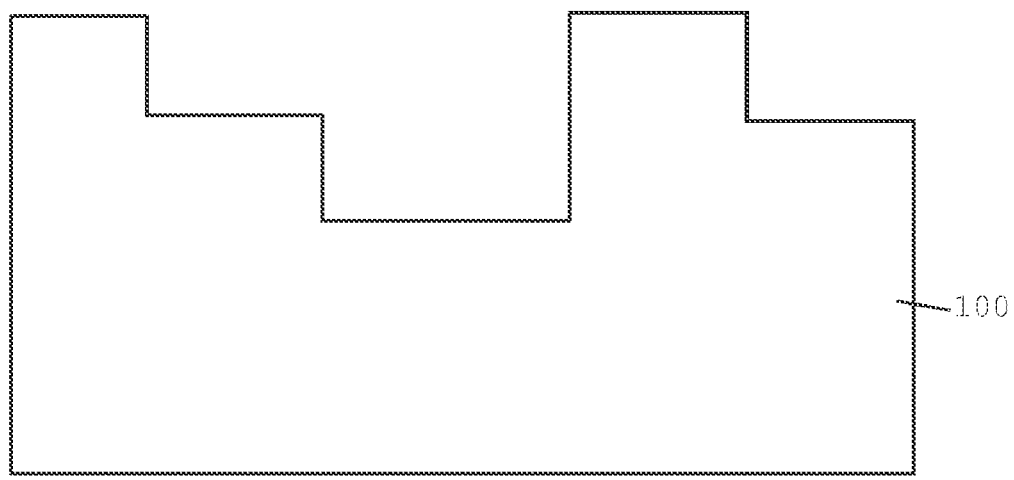
FIG. 5 shows the substrate after the processing step of FIG. 4.

This complex three dimensional topography can be used as a mask for a subsequent processing step as illustrated in FIG. 4. In FIG. 4 a process step such as ion mill, reactive ion etch (RIE) or wet etch is applied for removing material from the surface of substrate 100. The surface of substrate 100 is locally protected by mask 122 formed by the structures 118 and 120 provided by the polymerization step of FIG. 3. As a consequence the three dimensional topography of mask 120 is translated into the resulting structure of the surface of substrate 100, as shown in FIG. 5, because the degree of material removal from the surface of substrate 100 is modulated in accordance with the local thickness variations of mask 122 in the vertical direction.

Figure 6:
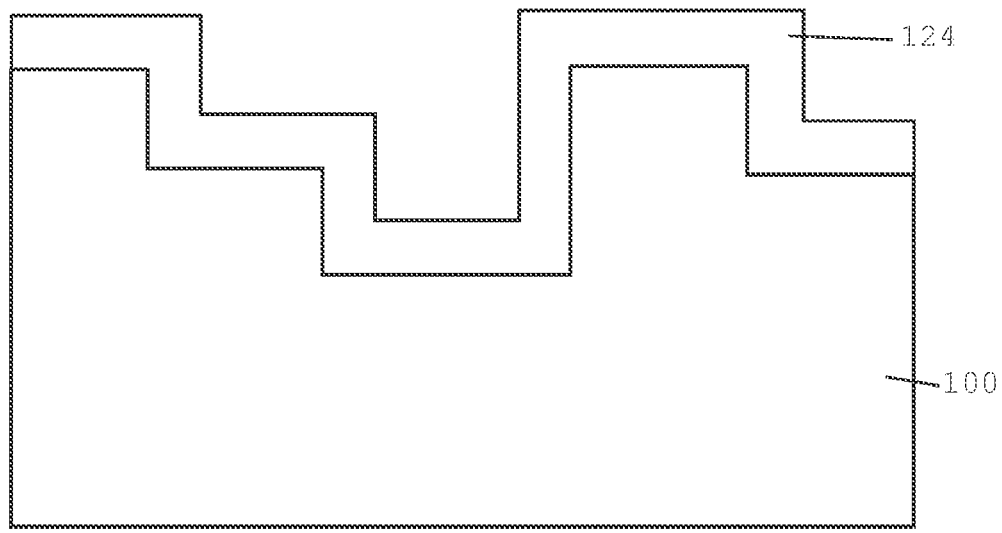
FIG. 6 shows the substrate after deposition of a layer of material having uniform thickness such as by crystal growth.

Subsequently a material deposition step can be performed in order to manufacture a semi-conductor or micro machined device. In the example considered in FIG. 6 a layer 124 of uniform thickness is deposited on the surface of substrate 100 such as by crystal growth. As compared to prior art photolithography techniques layer 124 has a complex three dimensional topography without any growth edges other than the surface of the substrate 100. Such a three dimensional structure without any additional growth edges cannot be realized by prior art multi layer photolithography techniques.

As a further advantage the resulting three dimensional topography can be manufactured with a high degree of precision as the tolerances which are an unavoidable consequence of the multi layer photolithography steps of the prior art are eliminated.

Figure 7:
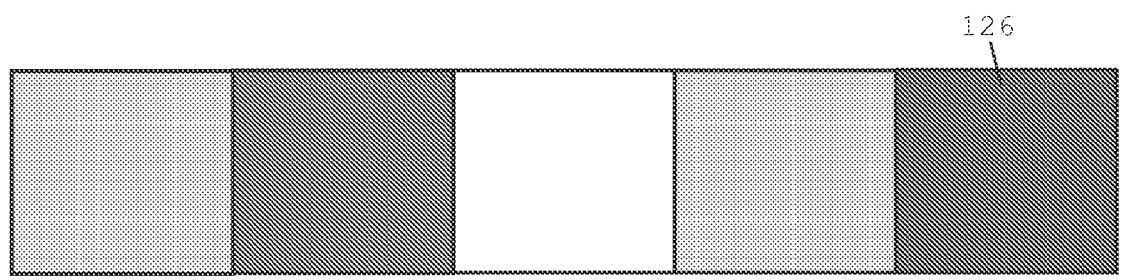
FIG. 7 shows an example of a gray mask.

FIG. 7 shows an example of a gray mask 126. Black areas of gray mask 126 absorb all of the impinging radiation, white areas are completely transparent for the radiation and gray areas absorb some of the radiation such that a corresponding modulation of the radiation field is provided.

Figure 8:
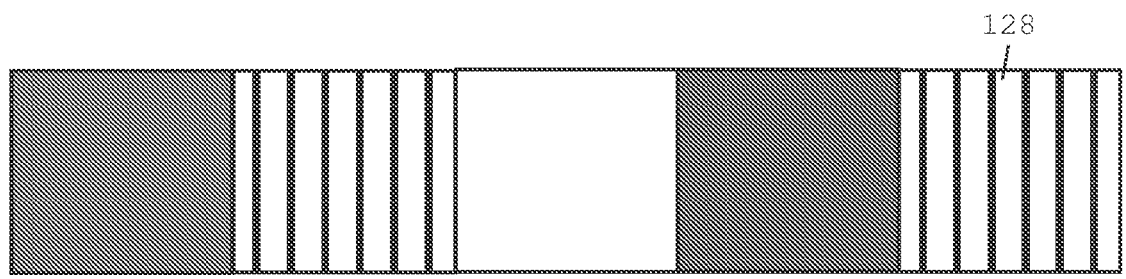
FIG. 8 shows an example of a grating mask.

In order to realize gray mask 126 of FIG. 7 a grating mask can be used. Such a grating mask 128 is shown by way of example in FIG. 8. Black areas are realized by full chromium (Cr) coverage while the areas with black bars symbolizing Cr bars only reduce the radiation intensity. The production of such grating masks is as such known from the prior art.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of structuring a substrate comprising the steps of:
   providing a polymerization starter layer on the substrate comprising a plurality of polymerization starters,
   applying a radiation field to the polymerization starter layer for selectively reducing a density of polymerization starters of the polymerization starter layer,
   applying monomers to the polymerization starter layer,
   polymerizing the monomers, the polymerizing being initiated by the starters of the polymerization starter layer, and
   structuring the substrate using the polymerized monomers as a mask.

2. The method of claim 1 further comprising immobilizing the polymerization starters on a surface of the substrate.

3. The method of claim 1 further comprising providing a coating on the substrate for forming of covalent bonds with the polymerization starters.

4. The method of claim 3, wherein the coating contains SiOx.

5. The method of claim 1, wherein the radiation field is a UV radiation field.

6. The method of claim 1, wherein the density of the polymerization starters is selectively reduced by cracking of some of the polymerization starters.

7. The method of claim 1, wherein the polymerization starter layer being a mono-molecular layer of polymerization starters.

8. The method of claim 1, wherein the radiation field is provided by means of a radiation source and a gray or a grating mask.

9. The method of claim 1, wherein the radiation field is chosen to provide a lens structure in the substrate, the lens structure having a defined focal point.

10. The method of claim 1 comprising performing a semi-conductor manufacturing step using the polymerized monomers as a mask.

11. The method of claim 1, wherein the step of structuring the substrate being performed by an ion mill, reactive ion etch (RIE) or wet etch process.

12. The method of claim 1 wherein in the step of polymerizing the monomers, a varied topography of the substrate is formed corresponding to the density of the polymerization starters of the polymerization starter layer, and
   wherein in the step of structuring the substrate, the varied topography is reproduced into the substrate.

* * * * *